United States Patent
Paydavosi

(10) Patent No.: US 12,490,477 B2
(45) Date of Patent: Dec. 2, 2025

(54) BINARY METALLIC ALLOY SOURCE AND DRAIN (BMAS) FOR APPLYING COMPRESSIVE STRESS IN NON-PLANAR TRANSISTOR ARCHITECTURES

(71) Applicant: SK Hynix NAND Product Solutions Corp., Rancho Cordova, CA (US)

(72) Inventor: Navid Paydavosi, Seattle, WA (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 846 days.

(21) Appl. No.: 17/353,225

(22) Filed: Jun. 21, 2021

(65) Prior Publication Data

US 2022/0406938 A1   Dec. 22, 2022

(51) Int. Cl.
*H10D 30/69* (2025.01)
*C22C 14/00* (2006.01)
(Continued)

(52) U.S. Cl.
CPC .......... *H10D 30/797* (2025.01); *C22C 14/00* (2013.01); *C22C 27/02* (2013.01);
(Continued)

(58) Field of Classification Search
CPC ..... H01L 21/823431; H01L 21/823821; H01L 21/845; H01L 27/0886; H01L 27/0924; H01L 27/1211; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823418; H01L 21/823814; H01L 21/823425; H01L 29/0847; H01L 29/7848; H01L 29/66636; H01L 29/66575; H01L 29/66643; H01L 29/7845; H01L 29/665–66507; H01L 21/28518; H01L 21/32053; H01L 21/76889; H01L 23/53209; H10B 12/36; H10B 12/056; H10D 84/0158; H10D 84/0193; H10D 84/834; H10D 84/853;
(Continued)

(56) References Cited

U.S. PATENT DOCUMENTS

2009/0104746 A1   4/2009 Clifton
2012/0273798 A1   11/2012 Alptekin
(Continued)

FOREIGN PATENT DOCUMENTS

EP   3644375   4/2020

OTHER PUBLICATIONS

Extended European Search Report for European Patent Application No. 22168957.3 mailed Sep. 15, 2022, 11 pgs.

*Primary Examiner* — Younes Boulghassoul
(74) *Attorney, Agent, or Firm* — Haley Guiliano LLP

(57) ABSTRACT

Embodiments disclosed herein include semiconductor devices and methods of forming such semiconductor devices. In an embodiment, a semiconductor device comprises a semiconductor channel, a source region adjacent to the semiconductor channel, and a drain region adjacent to the semiconductor channel. In an embodiment, the source region and the drain region each comprise a trench, a conformal silicide lining the trench, and a binary metallic alloy filling the trench.

16 Claims, 8 Drawing Sheets

(51) Int. Cl.
| | |
|---|---|
| C22C 27/02 | (2006.01) |
| H01L 21/285 | (2006.01) |
| H10D 30/01 | (2025.01) |
| H10D 30/62 | (2025.01) |
| H10D 30/67 | (2025.01) |
| H10D 62/10 | (2025.01) |
| H10D 64/01 | (2025.01) |
| H10D 64/23 | (2025.01) |
| H10D 84/01 | (2025.01) |
| H10D 84/03 | (2025.01) |
| H10D 84/85 | (2025.01) |

(52) U.S. Cl.
CPC ..... *H01L 21/28518* (2013.01); *H10D 30/024* (2025.01); *H10D 30/031* (2025.01); *H10D 30/62* (2025.01); *H10D 30/6219* (2025.01); *H10D 30/6713* (2025.01); *H10D 30/6729* (2025.01); *H10D 30/6735* (2025.01); *H10D 30/6737* (2025.01); *H10D 30/6743* (2025.01); *H10D 30/6757* (2025.01); *H10D 30/794* (2025.01); *H10D 62/118* (2025.01); *H10D 64/01* (2025.01); *H10D 64/256* (2025.01); *H10D 84/017* (2025.01); *H10D 84/0186* (2025.01); *H10D 84/0193* (2025.01); *H10D 84/038* (2025.01); *H10D 84/853* (2025.01)

(58) Field of Classification Search
CPC ............... H10D 86/011; H10D 86/215; H10D 30/024–0245; H10D 30/62–6219; H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 84/013; H10D 84/017; H10D 62/151; H10D 62/021; H10D 30/797; H10D 30/0277; H10D 30/6713; H10D 30/794; H10D 30/0212–0213
See application file for complete search history.

(56) References Cited

U.S. PATENT DOCUMENTS

| | | | |
|---|---|---|---|
| 2015/0221768 A1* | 8/2015 | Zhong | H01L 29/401 438/197 |
| 2016/0133745 A1* | 5/2016 | Kittl | H01L 21/76843 438/197 |
| 2016/0233164 A1* | 8/2016 | Choi | H01L 29/41791 |
| 2016/0276449 A1* | 9/2016 | Bae | H10D 30/6757 |
| 2017/0053916 A1* | 2/2017 | Ching | H01L 21/76831 |
| 2019/0131451 A1* | 5/2019 | Kittl | H01L 23/53271 |
| 2019/0371898 A1* | 12/2019 | Huang | H01L 29/7853 |
| 2020/0091011 A1* | 3/2020 | Khaderbad | H01L 21/823871 |
| 2020/0220016 A1* | 7/2020 | Guler | H01L 29/6681 |
| 2021/0104524 A1* | 4/2021 | Hwang | H01L 29/42392 |
| 2021/0367050 A1* | 11/2021 | Tsai | H01L 29/66553 |
| 2022/0068805 A1* | 3/2022 | Lee | H01L 29/7827 |
| 2022/0285493 A1* | 9/2022 | Kim | H01L 29/66553 |

* cited by examiner

BINARY METALLIC ALLOY SOURCE AND DRAIN (BMAS) FOR APPLYING COMPRESSIVE STRESS IN NON-PLANAR TRANSISTOR ARCHITECTURES

TECHNICAL FIELD

Embodiments of the disclosure are in the field of semiconductor structures and processing and, in particular, to source and drain architectures that include binary metallic alloys over a conformal semiconductor epi-layer.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
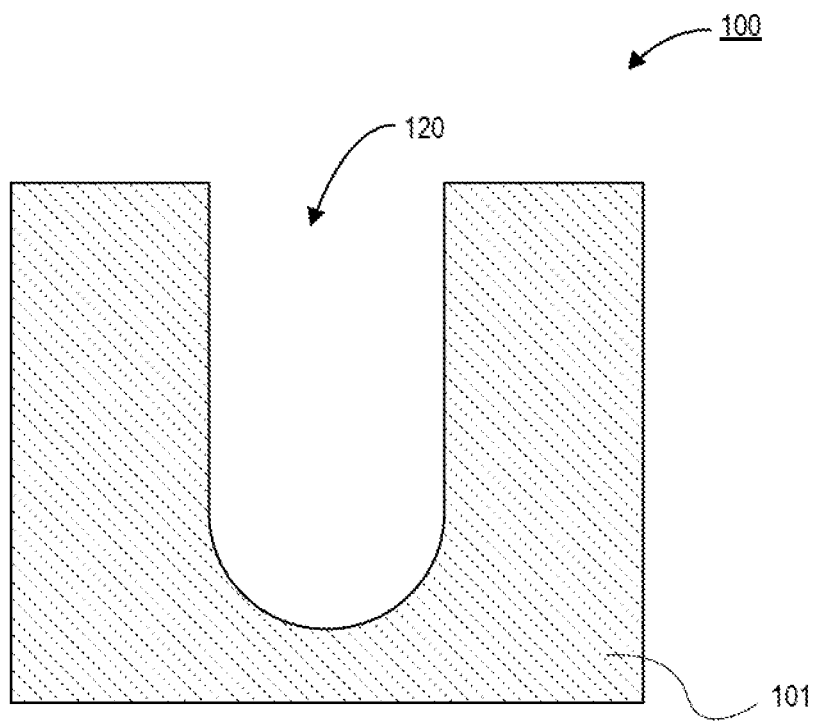
FIG. 1A is a cross-sectional illustration of a source/drain trench formed in a substrate, in accordance with an embodiment.

Embodiments described herein comprise source and drain architectures that include binary metallic alloys over a conformal semiconductor epi-layer. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Typically, the sources and drains in semiconductor devices are formed with epitaxially grown semiconductor materials. However, at advanced processing nodes, it has been shown that epi resistance is comparable, and possibly even larger, than the contact resistance to the source/drain region. The resistivity of epi increases along the height of the epi towards the bottom. As such, in non-planar architectures (e.g., fin-FET, gate-all-around (GAA), etc.) top-heavy conduction in the channels may occur. That is, the current passing through the channel may be non-uniform, top-to-bottom.

In addition to providing non-uniform conduction through the channel, the amount of channel stress (either compressive or tensile) is sensitive to the quality of the epitaxial growth. Any imperfection in the epi can result in a relaxed epi, and as a result, a relaxed channel. This may result in a decrease in electron or hole mobility, and ultimately can reduce the drive current through the channel.

Accordingly, embodiments disclosed herein include a source/drain architecture that includes a binary metallic alloy. Generally, a silicide layer lines the source/drain trench, and the remainder of the source/drain trench is filled by the binary metallic alloy. The binary metallic alloy is chosen so that it expands or contracts after an annealing process. The expansion/contraction induces stress (compressive or tensile) in the channel to boost hole or electron mobility. Additionally, the inclusion of a metal in the source/drain region reduces the parasitic resistance since the binary metal alloy has a lower resistance than an epitaxially grown semiconductor. Additionally, since the silicide is conformal and lines the trench, there is more surface area for the contact, which reduces the contact resistance.

Referring now to FIGS. 1A-1G, a series of cross-sectional illustrations depicting a process of forming source/drain regions with a binary metallic alloy is shown, in accordance with an embodiment. In the illustrated embodiment, a single source/drain region isolated from other components of the semiconductor device (e.g., channels, gate stacks, etc.) is shown in order to not obscure embodiments disclosed herein. However, it is to be appreciated that other features of a semiconductor device may be fabricated before, after, or at the same time as the fabrication of the source/drain region shown in FIGS. 1A-1G.

Referring now to FIG. 1A, a cross-sectional illustration of a semiconductor device 100 is shown, in accordance with an embodiment. The semiconductor device 100 may comprise a substrate 101. In an embodiment, the substrate 101 is a semiconductor substrate, such as silicon. In other embodiments, the substrate 101 may be an insulating layer over a semiconductor substrate. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, a trench 120 is formed into the substrate 101. The trench may be a standard source/drain trench. In an embodiment standard EUC etching processes may be used to form the trench 120. The trench 120 may have substantially vertical sidewalls. In an embodiment, a bottom surface of the trench may be rounded. The portion of the substrate 101 adjacent to the sidewalls of the trench 120 may be the channels of the semiconductor device 100. While shown as a single layer, such as a fin, the channels may also be nanowire or nanoribbon channels, as will be described in greater detail below.

Figure 1B:
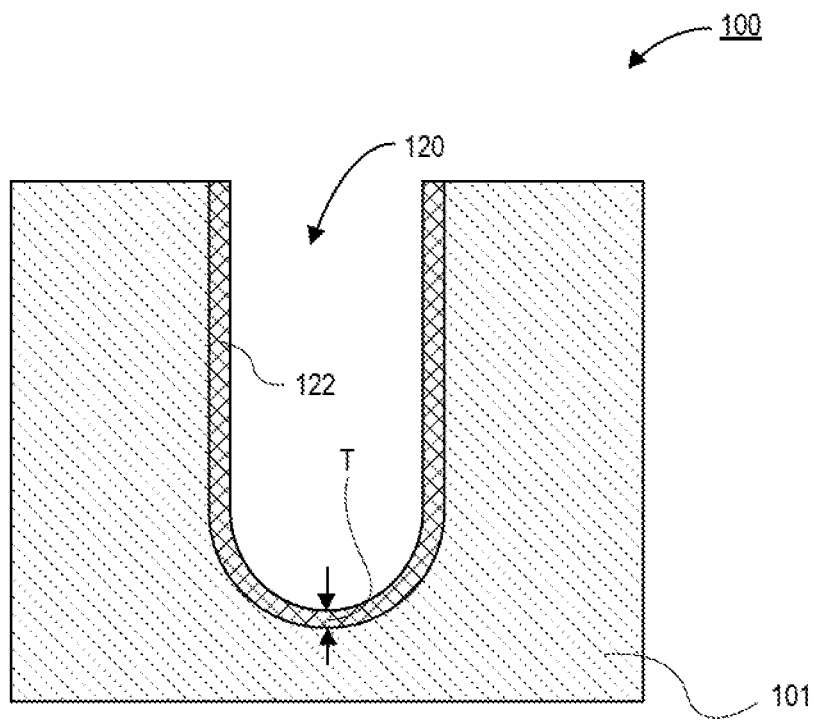
FIG. 1B is a cross-sectional illustration of the source/drain trench after being lined with a semiconductor layer, in accordance with an embodiment.

Referring now to FIG. 1B, a cross-sectional illustration of the semiconductor device 100 after deposition of a semiconductor layer 122 is shown, in accordance with an embodiment. In an embodiment, the semiconductor layer 122 may be conformally deposited in the trench 120. As such, the semiconductor layer 122 may have a substantially uniform thickness T along the sidewalls of the trench 120 and over the bottom surface of the trench 120. In an embodiment, the thickness T may be approximately 10 nm or smaller. In a particular embodiment, the thickness T may be approximately 8 nm. In an embodiment, the semiconductor layer is a super saturated amorphous epitaxial layer. For example, heavy dopant atoms (e.g., As for NMOS, or Ga for PMOS) may be used to dope the semiconductor layer 122.

Figure 1C:
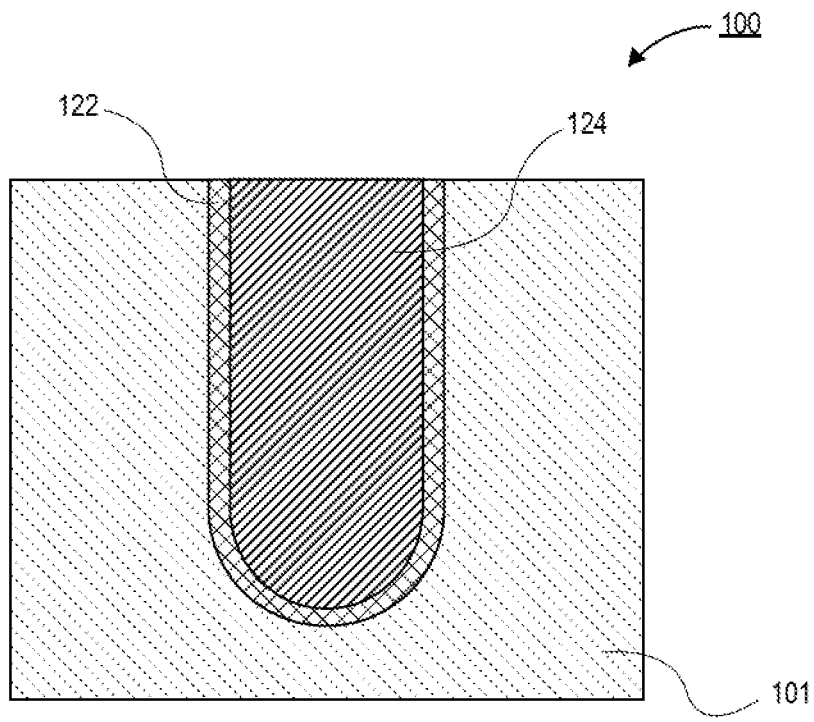
FIG. 1C is a cross-sectional illustration of the semiconductor device after a host metal is disposed in the trench, in accordance with an embodiment.

Referring now to FIG. 1C, a cross-sectional illustration of the semiconductor device 100 after a host metal 124 is disposed in the trench 120 is shown, in accordance with an embodiment. As shown, the host metal 124 may completely fill the remainder of the trench 120 that was not filled by the semiconductor layer 122. It is to be appreciated that since the semiconductor layer 122 was conformally deposited, there is a relatively large interface between the semiconductor layer 122 and the host metal 124. This large surface area (e.g., compared to a contact to only a top surface of the source/drain epi, as is common in existing architectures) reduces the contact resistance of the semiconductor device 100. Additionally, due to the large volume of metal in the source/drain region, the resistance is decreased, and more uniform conduction through the height of the channel is provided, as opposed to having a top-heavy conduction typical of existing epi source/drain regions. In an embodiment, the host metal 124 may be any metal that can be alloyed with a seed metal to provide a binary alloy that can increase or decrease in volume. For example, host metals 124 that are compatible with semiconductor manufacturing processes may include titanium and tantalum.

Figure 1D:
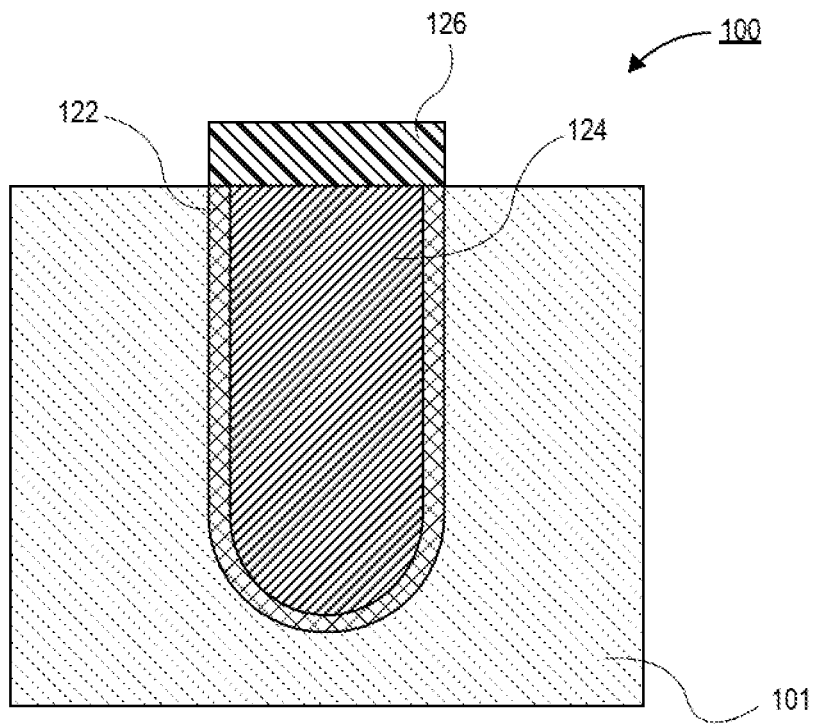
FIG. 1D is a cross-sectional illustration of the semiconductor device after a capping layer is disposed over the host metal, in accordance with an embodiment.

Referring now to FIG. 1D, a cross-sectional illustration of the semiconductor device 100 after a capping layer 126 is provided over the host metal 124 and the semiconductor layer 122 is shown, in accordance with an embodiment. In an embodiment, the capping layer 126 may be hardmask material. The capping layer 126 confines the host metal 124. This is important in subsequent processing operations when the host metal 124 expands during an annealing process. Without the capping layer 126, the volume of the host metal 124 would expand upwards, and would not sufficiently stress the adjacent channels. In FIG. 1D, the capping layer 126 is shown without any adjacent material, and appears to be perfectly aligned with the host metal 124 and the semiconductor layer 122. However, it is to be appreciated that spacer materials or the like may be adjacent to the capping layer 126 in some embodiments.

Figure 1E:
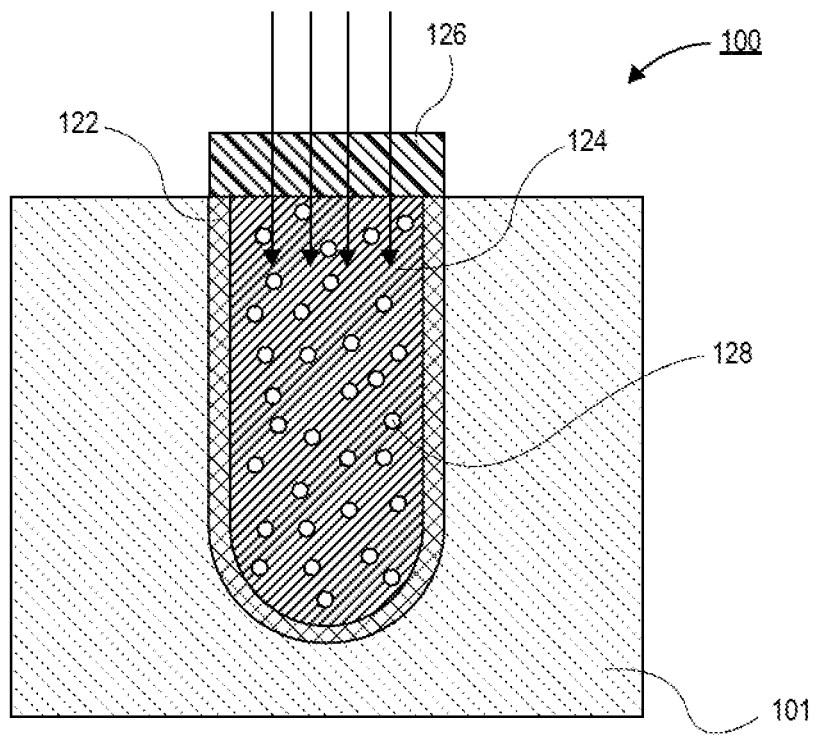
FIG. 1E is a cross-sectional illustration of the semiconductor device after seed metal is implanted into the host metal, in accordance with an embodiment.

Referring now to FIG. 1E, a cross-sectional illustration of the semiconductor device 100 after a seed metal 128 is implanted into the host metal 124 is shown, in accordance with an embodiment. In an embodiment, the seed metal 128 may be implanted through the capping layer 126, as indicated by the arrows. In an embodiment, the amount of seed metal 128 implanted into the host metal 124 may be sufficient to provide a composition of approximately 80 atomic percent or more host metal 124 and approximately 20 atomic percent or less seed metal 128. In a particular embodiment, the atomic percentage of the host metal 124 may be approximately 90 percent, and the atomic percentage of the seed metal 128 may be approximately 10 percent. In an embodiment, the implant of the seed metal 128 may be approximately $1E^{21}$ atoms/cm$^3$ or more. In a particular embodiment, the implant of the seed metal 128 may be approximately $5.5E^{21}$ atoms/cm$^3$ or more. Additionally, it is to be appreciated that the energy of the implant is chosen so that a distribution of the seed metal 128 peaks in the middle (i.e., the middle from top to bottom) of the host metal 124.

In an embodiment, the seed metal 128 is chosen to provide the desired expansion or contraction of the host metal 124 after an annealing process alloys the seed metal 128 with the host metal 124 to form a binary alloy. In an embodiment, seed metal 128 elements may include, but are not limited to, silver, aluminum, chromium, manganese, hafnium, tin, zirconium, and tungsten. A contraction of the binary alloy provides a tensile stress on the channel, which is desired in the case of NMOS devices. Some examples of binary alloys suitable for NMOS devices include titanium-silver, titanium-aluminum, titanium-chromium, titanium-manganese, and tantalum-tungsten. An expansion of the binary alloy provides a compressive stress on the channel, which is desired in the case of PMOS devices. Some examples of binary alloys suitable for PMOS devices include titanium-hafnium, titanium-tin, titanium-zirconium, and tantalum-zirconium.

Figure 1F:
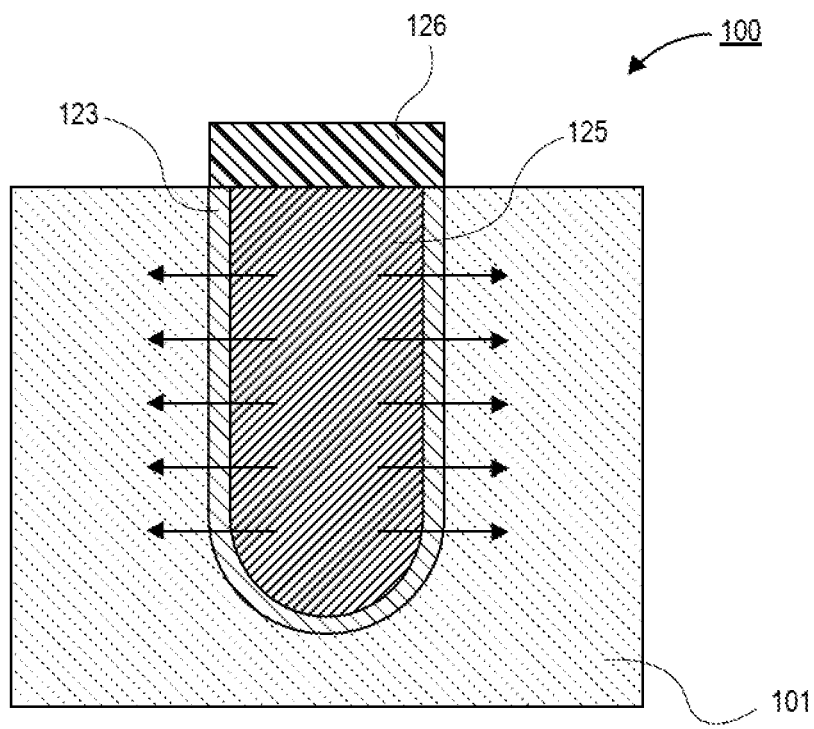
FIG. 1F is a cross-sectional illustration of the semiconductor device after an alloying anneal to form a binary metallic alloy in the trench that applies compressive stress on the neighboring channels, in accordance with an embodiment.

Referring now to FIG. 1F, a cross-sectional illustration of the semiconductor device 100 after an alloying anneal is shown, in accordance with an embodiment. In an embodiment, the alloying anneal implements two changes in the semiconductor device 100. First, the anneal alloys the host metal 124 with the seed metal 128 to form a binary alloy 125. Second the alloying anneal converts the semiconductor layer 122 into a host silicide 123 (e.g., a titanium silicide or a tantalum silicide). The alloying anneal may be implemented specifically to provide the annealing and alloying. In other embodiments, anneals for other structural features in the semiconductor device 100 may also be used to provide the alloying anneal. For example, a high-k dielectric anneal or a reliability anneal that are typically included in a process flow may be used as the alloying anneal.

Figure 1G:
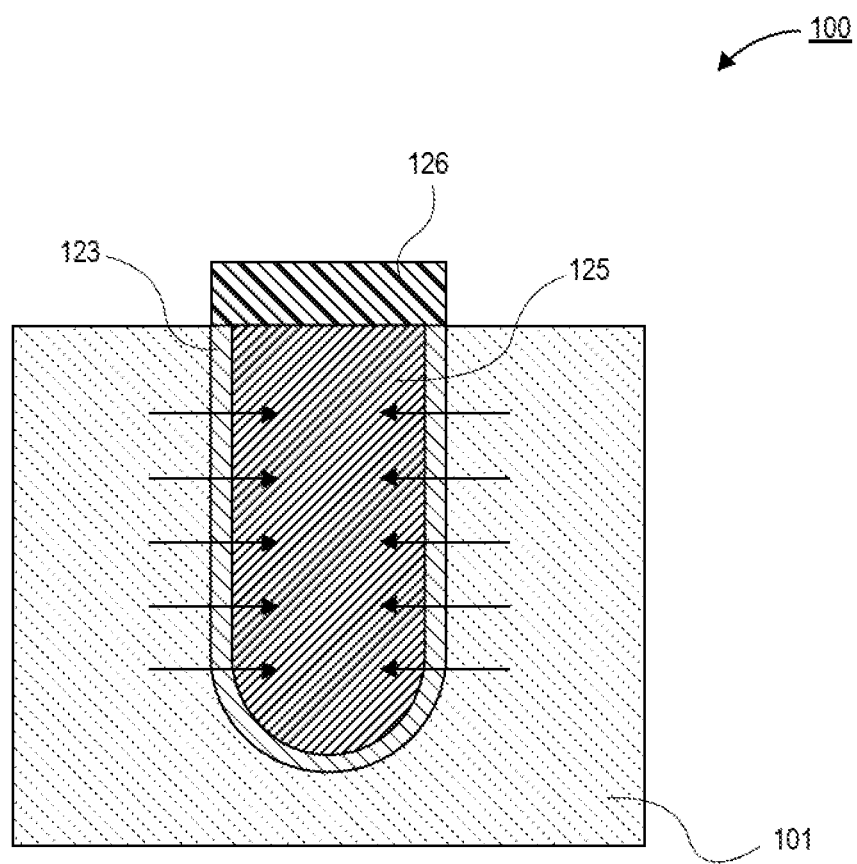
FIG. 1G is a cross-sectional illustration of the semiconductor device after an alloying anneal to form a binary metallic alloy in the trench that applies a tensile stress on the neighboring channels, in accordance with an embodiment.

As shown in FIG. 1F, the formation of the binary alloy 125 results in a compressive stress applied to the neighboring channels in the substrate 101. Such a binary alloy 125 is typically used in a PMOS semiconductor device 100. The stress is formed because the binary alloy 125 wants to expand, but is confined by the trench along the sides and bottom, and by the capping layer 126 above. As shown in FIG. 1G, the formation of the binary alloy 125 results in a tensile stress applied to the neighboring channels in the substrate 101. Such a binary alloy 125 is typically used in an NMOS semiconductor device 100. The stress is formed because the binary alloy 125 wants to contract, but is secured by the surfaces of the silicide 123.

After the alloying anneal, the capping layer 126 may be removed. The capping layer 126 may be removed with any hardmask etching process, typical in the area of semiconductor fabrication. The top surface of the binary alloy 125 is exposed by the removal of the capping layer 126. As such, a source/drain contact (e.g., a trench contact (TCN)) may land on the top surface of the binary alloy 125.

Figure 2:
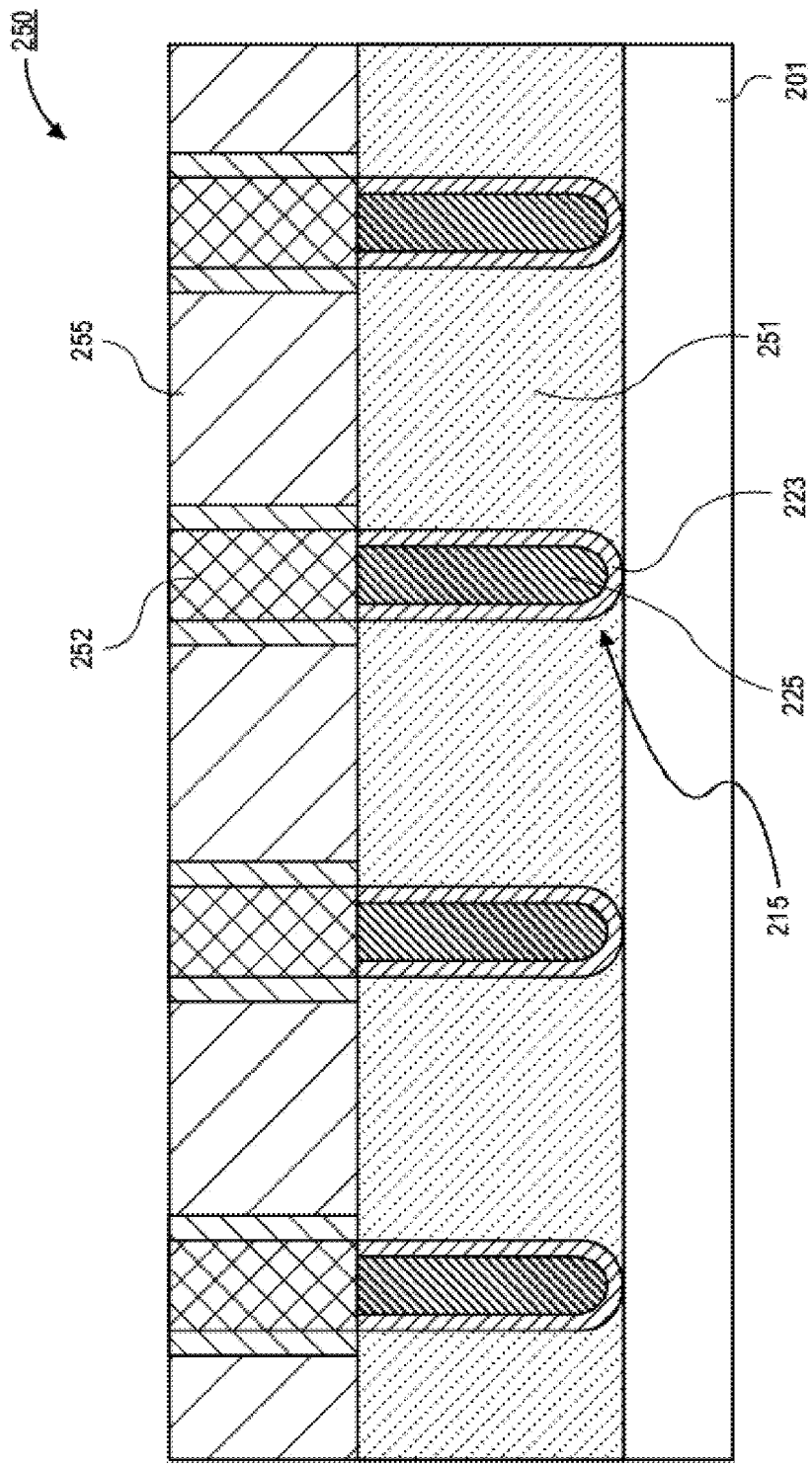
FIG. 2 is a cross-sectional illustration of a fin-FET device with source/drain regions that comprise a binary metallic alloy, in accordance with an embodiment.

Referring now to FIG. 2, a cross-sectional illustration of a semiconductor device 250 is shown, in accordance with an embodiment. In an embodiment, the semiconductor device 250 is a non-planar transistor device. Particularly, the semiconductor device 250 in FIG. 2 is a fin-FET device or other similar tri-gate device. The cross-sectional view shown in FIG. 2 is along the length of the fin. In an embodiment, the semiconductor device 250 comprises a substrate 201. The substrate 201 may be a semiconductor substrate in some embodiments. In other embodiments, the substrate 201 may be an insulative layer over an underlying semiconductor layer.

In an embodiment, source/drain regions 215 may separate the channels 251. The channels 251 may be silicon or other semiconductor material. The channels 251 may be part of the fin of the fin-FET device. In an embodiment, the source/drain regions 215 may be similar to the source/drain region described in greater detail above. For example, the source/drain regions 215 may comprise a trench that is lined by a silicide layer 223 and filled by a binary metallic alloy 225. In an embodiment, the binary metallic alloy 225 may comprise a host metal and a seed metal. The host metal may comprise titanium or tantalum, and the seed metal may include, but is not limited to, silver, aluminum, chromium, manganese, hafnium, tin, zirconium, and tungsten. The binary metallic alloy 225 of the source/drain regions 215 may apply a compressive stress on the channels 251 or a tensile stress on the channels 251. Compressive stress may be used in PMOS devices, and tensile stress may be used in NMOS devices. In an embodiment, contacts 252 (e.g., a TCN) may land on a top surface of the source/drain regions 215. That is, the contact 252 may be in direct contact with the binary metallic alloy 225.

In an embodiment, a gate stack 255 is provided over the channel 251. In the illustrated embodiment, the gate stack 255 is only over a top surface of the channel 251. However, it is to be appreciated that the gate stack 255 wraps around the sides of the channel 251 into and out of the plane of FIG. 2. Additionally, while shown as a single block of material, it is to be appreciated that the gate stack 255 may comprise multiple layers. For example, the gate stack 255 may comprise a gate dielectric, a workfunction metal, and a fill metal.

In an embodiment, the gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

When the workfunction metal will serve as an N-type workfunction metal, the workfunction metal preferably has a workfunction that is between about 3.9 eV and about 4.2 eV. N-type materials that may be used to form the workfunction metal include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the workfunction metal will serve as a P-type workfunction metal, the workfunction metal preferable has a workfunction that is between about 4.9 eV and about 5.2 eV. P-type materials that may be used to form the workfunction metal include, but are not limited to, ruthenium, palladium, platinum, cobalt, nickel, and conductive metal oxides, e.g., ruthenium oxide. In an embodiment, the fill metal may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example.

Figure 3:
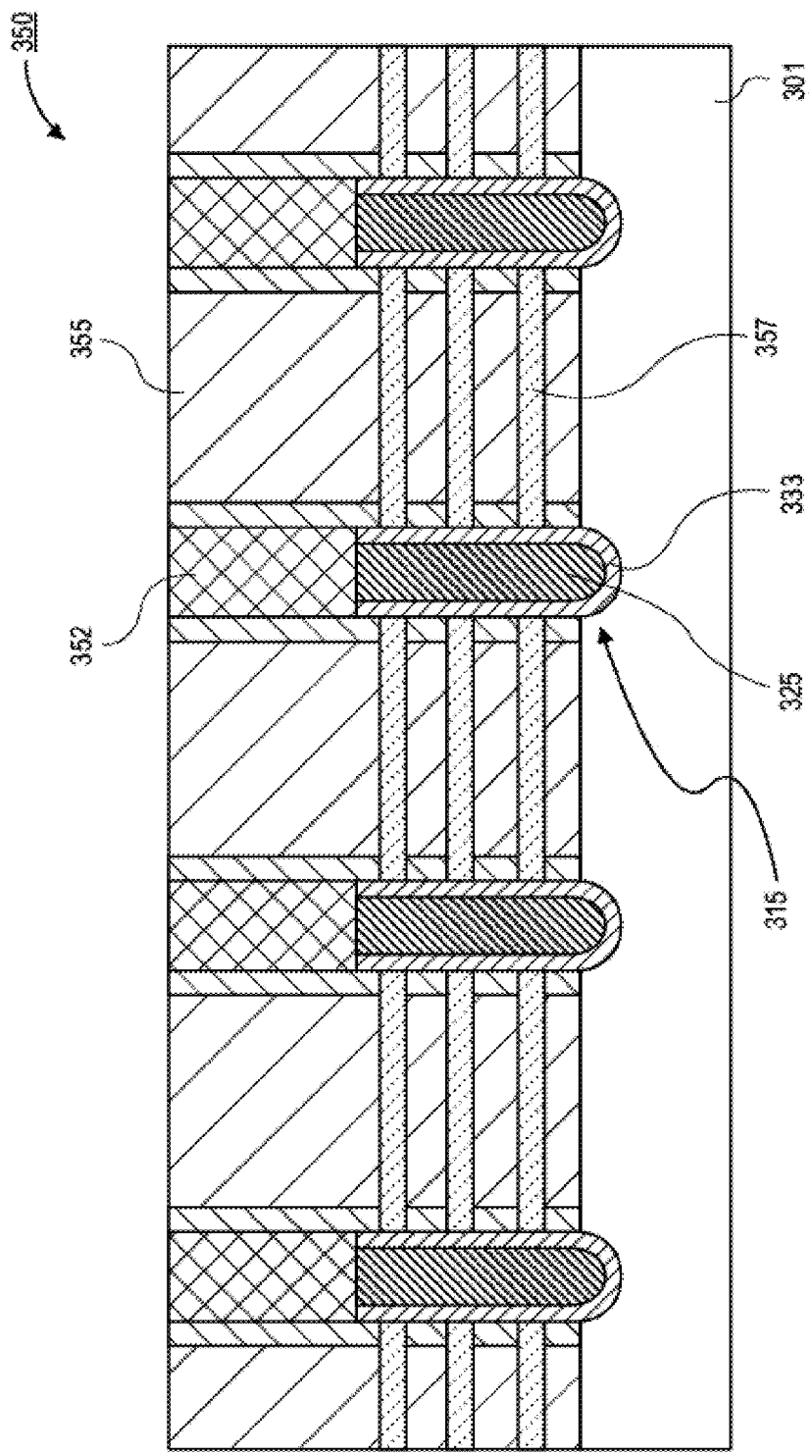
FIG. 3 is a cross-sectional illustration of a gate-all-around (GAA) device with source/drain regions that comprise a binary metallic alloy, in accordance with an embodiment.

Referring now to FIG. 3, a cross-sectional illustration of a semiconductor device 350 is shown, in accordance with an embodiment. In an embodiment, the semiconductor device 350 is a non-planar transistor device. Particularly, the semiconductor device 350 in FIG. 3 is a gate-all-around (GAA) device, such as a nanowire or nanoribbon transistor. The cross-sectional view shown in FIG. 3 is along the length of the nanoribbon channels 357. In an embodiment, the semiconductor device 350 comprises a substrate 301. The substrate 301 may be a semiconductor substrate in some embodiments. In other embodiments, the substrate 301 may be an insulative layer over an underlying semiconductor layer.

In an embodiment, source/drain regions 315 may separate the nanoribbon (or nanowire) channels 357. The nanoribbon channels 357 may be silicon or other semiconductor material. In an embodiment, the source/drain regions 315 may be similar to the source/drain region described in greater detail above. For example, the source/drain regions 315 may comprise a trench that is lined by a silicide layer 333 and filled by a binary metallic alloy 325. In an embodiment, the binary metallic alloy 325 may comprise a host metal and a seed metal. The host metal may comprise titanium or tantalum, and the seed metal may include, but is not limited to, silver, aluminum, chromium, manganese, hafnium, tin, zirconium, and tungsten. The binary metallic alloy 325 of the source/drain regions 315 may apply a compressive stress on the nanoribbon channels 357 or a tensile stress on the nanoribbon channels 357. Compressive stress may be used in PMOS devices, and tensile stress may be used in NMOS devices. In an embodiment, contacts 352 (e.g., a TCN) may land on a top surface of the source/drain regions 315. That is, the contact 352 may be in direct contact with the binary metallic alloy 325.

In an embodiment, a gate stack 355 is provided over the nanoribbon channels 357. In the illustrated embodiment, the gate stack 355 is over a top surface and a bottom surface of each nanoribbon channel 357. However, it is to be appreciated that the gate stack 355 wraps around the sides of the nanoribbon channels 357 into and out of the plane of FIG. 3. As such, the gate stack 355 contacts an entire perimeter of the nanoribbon channels 357 to provide GAA control. Additionally, while shown as a single block of material, it is to be appreciated that the gate stack 355 may comprise multiple layers. For example, the gate stack 355 may comprise a gate dielectric, a workfunction metal, and a fill metal. The gate dielectric, the workfunction metal, and the fill metal may be substantially similar to the materials described above with respect to FIG. 2.

Figure 4:
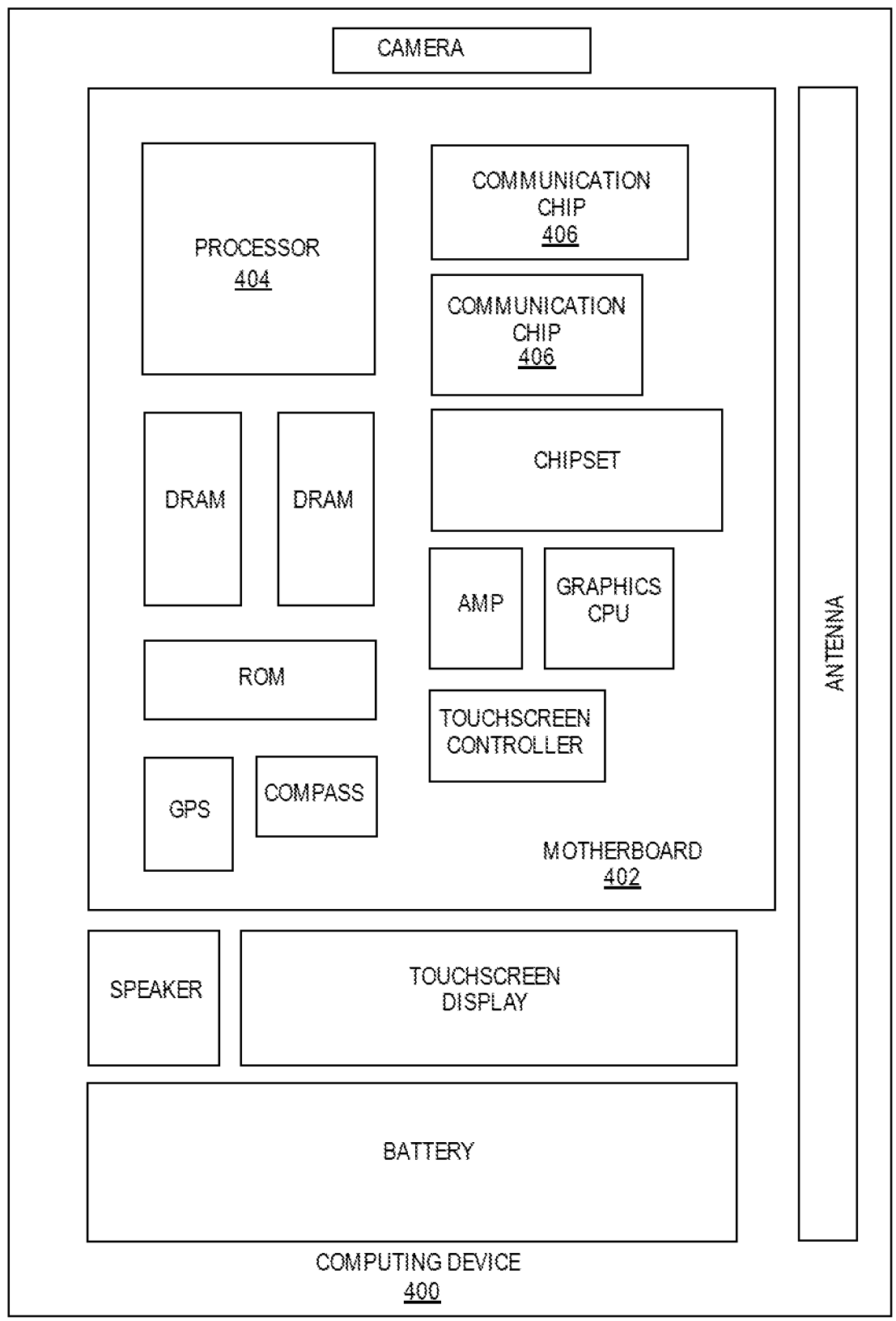
FIG. 4 illustrates a computing device in accordance with one implementation of an embodiment of the disclosure.

FIG. 4 illustrates a computing device 400 in accordance with one implementation of an embodiment of the disclosure. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In an embodiment, the integrated circuit die of the processor may comprise a transistor device with a source/drain region that comprises a binary metallic alloy, as described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In an embodiment, the integrated circuit die of the communication chip may comprise a transistor device with a source/drain region that comprises a binary metallic alloy, as described herein.

In further implementations, another component housed within the computing device 400 may comprise a transistor device with a source/drain region that comprises a binary metallic alloy, as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
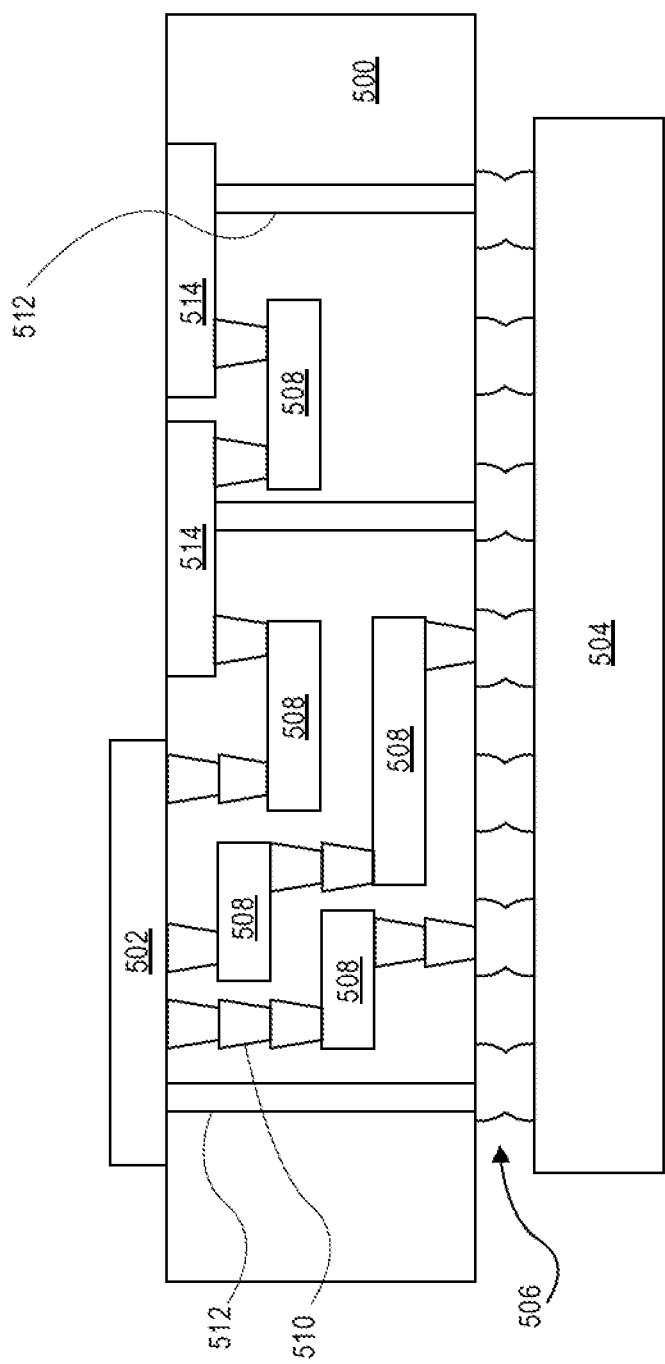
FIG. 5 is an interposer implementing one or more embodiments of the disclosure.

FIG. 5 illustrates an interposer 500 that includes one or more embodiments of the disclosure. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. In an embodiment, one of both of the first substrate 502 and the second substrate 504 may comprise a PMOS transistor device with an interface layer between the semiconductor source/drain region and a barrier layer of the source/drain contact, in accordance with embodiments described herein. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer 500 may be formed of alternate rigid or flexible materials that may include the same materials described above for use in a semiconductor substrate, such as silicon, germanium, and other group III-V and group IV materials.

The interposer 500 may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the disclosure, apparatuses or processes disclosed herein may be used in the fabrication of interposer 500.

Thus, embodiments of the present disclosure may comprise a transistor device with a source/drain region that comprises a binary metallic alloy.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a semiconductor device, comprising: a semiconductor channel; a source region adjacent to the semiconductor channel; and a drain region adjacent to the semiconductor channel, wherein the source region and the drain region each comprise: a trench; a conformal silicide lining the trench; and a binary metallic alloy filling the trench.

Example 2: the semiconductor device of Example 1, wherein the binary metallic alloy provides a compressive stress on the semiconductor channel.

Example 3: the semiconductor device of Example 1, wherein the binary metallic alloy provides a tensile stress on the semiconductor channel.

Example 4: the semiconductor device of Examples 1-3, wherein binary metallic alloy comprises a host element and a seed element.

Example 5: the semiconductor device of Example 4, wherein the host element comprises titanium or tantalum.

Example 6: the semiconductor device of Example 4 or Example 5, wherein the seed element comprises silver, aluminum, chromium, manganese, hafnium, tin, zirconium, or tungsten.

Example 7: the semiconductor device of Examples 1-6, wherein the conformal semiconductor layer has a thickness of approximately 10 nm or smaller.

Example 8: the semiconductor device of Examples 1-7, wherein the semiconductor device is a non-planar transistor.

Example 9: the semiconductor device of Example 8, wherein the non-planar transistor is a fin-FET transistor.

Example 10: the semiconductor device of Example 8, wherein the non-planar transistor is a gate-all-around (GAA) transistor.

Example 11: the method of forming a semiconductor device, comprising: forming a trench; conformally growing a semiconductor layer along the surfaces of the trench; filling the trench with a host metal; disposing a capping layer over the trench; implanting a seed metal into the host metal through the capping layer; and annealing the transistor device, wherein the annealing forms a binary alloy out of the host metal and the seed metal, and converts the semiconductor layer into a silicide.

Example 12: the method of Example 11, wherein the binary alloy applies a compressive stress on the silicide.

Example 13: the method of Example 11, wherein the binary alloy applies a tensile stress on the silicide.

Example 14: the method of Examples 11-13, wherein a composition of the binary alloy comprises approximately 90 atomic percent or more of the host metal.

Example 15: the method of Examples 11-14, wherein the host metal comprises titanium or tantalum.

Example 16: the method of Examples 11-15, wherein the seed element comprises silver, aluminum, chromium, manganese, hafnium, tin, zirconium, or tungsten.

Example 17: the method of Examples 11-16, wherein the semiconductor layer has a thickness that is approximately 10 nm or smaller.

Example 18: the method of Examples 11-17, wherein the semiconductor device is a fin-FET device or a gate-all-around (GAA) device.

Example 19: an electronic system, comprising: a board; a package substrate coupled to the board; and a die coupled to the package substrate, wherein the die comprises a semiconductor device comprising: a semiconductor channel; a source region adjacent to the semiconductor channel; and a drain region adjacent to the semiconductor channel, wherein the source region and the drain region each comprise: a trench; a conformal silicide lining the trench; and a binary metallic alloy filling the trench.

Example 20: the electronic system of Example 19, wherein the semiconductor device is a fin-FET device or a gate-all-around (GAA) device.

What is claimed is:

1. A semiconductor device, comprising:
   a semiconductor channel;
   a source region adjacent to the semiconductor channel; and
   a drain region adjacent to the semiconductor channel, wherein the source region and the drain region each comprise:
   a trench in the semiconductor channel;
   a conformal silicide layer lining the trench; and
   a binary metallic alloy filling the trench, wherein the binary metallic alloy is configured to apply a compressive stress to the semiconductor channel based on being annealed with a capping layer disposed over the trench.

2. The semiconductor device of claim 1, wherein binary metallic alloy comprises a host element and a seed element.

3. The semiconductor device of claim 2, wherein the host element comprises titanium or tantalum.

4. The semiconductor device of claim 2, wherein the seed element comprises hafnium, tin, or zirconium.

5. The semiconductor device of claim 1, wherein the conformal silicide semiconductor layer has a thickness of approximately 10 nm or smaller.

6. The semiconductor device of claim 1, wherein the semiconductor device is a non-planar transistor.

7. The semiconductor device of claim 6, wherein the non-planar transistor is a fin-FET transistor.

8. The semiconductor device of claim 6, wherein the non-planar transistor is a gate-all-around (GAA) transistor.

9. A method of forming a semiconductor device, the method comprising:
   forming a semiconductor channel;
   forming a source region adjacent to the semiconductor channel;
   forming a drain region adjacent to the semiconductor channel, and wherein the forming the source region and the drain region comprises:
      forming a trench in the semiconductor channel;
      conformally growing a semiconductor layer along the surfaces of the trench;
      filling the trench with a host metal;
      disposing a capping layer over the trench;
      implanting a seed metal into the host metal through the capping layer; and
      annealing the semiconductor device, wherein the annealing forms a binary metallic alloy comprising the host metal and the seed metal and converts the semiconductor layer to a conformal silicide layer lining the trench, and wherein the binary metallic alloy fills the trench and is configured to apply a compressive stress to the semiconductor channel based on the annealing with the capping layer disposed over the trench.

10. The method of claim 9, wherein a composition of the binary alloy comprises approximately 90 atomic percent or more of the host metal.

11. The method of claim 9, wherein the host metal comprises titanium or tantalum.

12. The semiconductor device of claim 9, wherein the seed element comprises hafnium, tin, or zirconium.

13. The method of claim 9, wherein the semiconductor layer has a thickness that is approximately 10 nm or smaller.

14. The method of claim 9, wherein the semiconductor device is a fin-FET device or a gate-all-around (GAA) device.

15. An electronic system, comprising:
   a board;
   a die coupled to the package substrate, wherein the die comprises a semiconductor device comprising:
      a semiconductor channel;
      a source region adjacent to the semiconductor channel; and
      a drain region adjacent to the semiconductor channel, wherein the source region and the drain region each comprise:
         a trench in the semiconductor channel;
         a conformal silicide layer lining the trench; and
         a binary metallic alloy filling the trench, wherein the binary metallic alloy is configured to apply a compressive stress to the semiconductor channel based on being annealed with a capping layer disposed over the trench.

16. The electronic system of claim 15, wherein the semiconductor device is a fin-FET device or a gate-all-around (GAA) device.

* * * * *